United States Patent
Jain et al.

(10) Patent No.: US 11,894,845 B1
(45) Date of Patent: Feb. 6, 2024

(54) STRUCTURE AND METHOD FOR DELAYING OF DATA SIGNAL FROM PULSE LATCH WITH LOCKUP LATCH

(71) Applicant: GlobalFoundries U.S. Inc., Malta, NY (US)

(72) Inventors: Navneet K. Jain, Milpitas, CA (US); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/898,937

(22) Filed: Aug. 30, 2022

(51) Int. Cl.
| H03K 3/00 | (2006.01) |
| H03K 3/012 | (2006.01) |
| H03K 5/01 | (2006.01) |
| H03K 3/037 | (2006.01) |
| H03K 5/00 | (2006.01) |

(52) U.S. Cl.
CPC ............ H03K 3/012 (2013.01); H03K 3/037 (2013.01); H03K 5/01 (2013.01); *H03K 2005/00013* (2013.01)

(58) Field of Classification Search
CPC .......... H03K 3/012; H03K 3/037; H03K 5/01; H03K 2005/00013
USPC ........................................................ 327/199
See application file for complete search history.

(56) References Cited

U.S. PATENT DOCUMENTS

| 5,644,499 | A | * | 7/1997 | Ishii | H03K 5/13 716/114 |
| 5,896,299 | A | | 4/1999 | Ginetti et al. | |
| 6,335,955 | B1 | * | 1/2002 | Knotts | H04L 7/02 327/252 |
| 6,698,005 | B2 | * | 2/2004 | Lindkvist | G06F 30/327 716/108 |
| 7,127,695 | B2 | * | 10/2006 | Huang | G01R 31/318591 716/108 |
| 7,278,126 | B2 | | 10/2007 | Sun et al. | |
| 7,761,748 | B2 | * | 7/2010 | Takano | G01R 31/31726 714/707 |
| 8,230,283 | B2 | * | 7/2012 | Gillis | G01R 31/31725 714/731 |
| 8,484,523 | B2 | * | 7/2013 | Ramaraju | G06F 11/267 714/731 |
| 8,717,078 | B2 | * | 5/2014 | Idgunji | H03K 3/0375 327/202 |
| 8,788,896 | B2 | * | 7/2014 | Tekumalla | G01R 31/318541 714/30 |
| 9,083,325 | B2 | * | 7/2015 | Datta | H03K 3/0375 |
| 9,171,112 | B2 | | 10/2015 | Kalpat et al. | |
| 9,385,696 | B1 | * | 7/2016 | Jangity | H03K 5/05 |
| 9,618,579 | B2 | * | 4/2017 | Chakraborty | G01R 31/318588 |
| 9,798,352 | B1 | * | 10/2017 | Majumdar | G06F 1/10 |

(Continued)

*Primary Examiner* — Ryan Jager
(74) *Attorney, Agent, or Firm* — David Cain; Hoffman Warnick LLC

(57) ABSTRACT

Embodiments of the disclosure provide a structure and related method to delay data signals through a data path using a lockup latch driven by the inverse of a clock signal. A structure according to the disclosure provides a launch pulse latch coupled to a capture pulse latch through a data path. The data path includes a combinational logic for processing signals within the data path. An edge of a clock signal drives the launch pulse latch and the capture pulse latch. A lockup latch is within the data path between the launch pulse latch and the capture pulse latch. An inverse of the clock signal drives the lockup latch.

14 Claims, 3 Drawing Sheets

(56) References Cited

U.S. PATENT DOCUMENTS

| | | | |
|---|---|---|---|
| 9,811,624 B2 | 11/2017 | van Ginneken et al. | |
| 9,837,995 B2* | 12/2017 | Hamdan | H03K 5/135 |
| 10,599,603 B1* | 3/2020 | Agrawal | H03K 17/81 |
| 10,788,877 B1* | 9/2020 | Ventrone | G06F 1/32 |
| 2005/0094446 A1* | 5/2005 | Terazawa | G06F 1/10 |
| | | | 365/200 |
| 2011/0060952 A1* | 3/2011 | Asai | G11C 29/50 |
| | | | 714/718 |
| 2013/0222029 A1* | 8/2013 | Bowers | G06F 9/3869 |
| | | | 327/198 |
| 2014/0368247 A1 | 12/2014 | Datta et al. | |

* cited by examiner

STRUCTURE AND METHOD FOR DELAYING OF DATA SIGNAL FROM PULSE LATCH WITH LOCKUP LATCH

BACKGROUND

Design and testing of integrated circuits includes analysis of the starting and arrival time of data in the IC to avoid delays in data and/or mismatches in pulse timing for various elements driven by clock signals. One concern is the avoidance of hold time violations in an IC during operation. Hold time refers to the minimum time in which data in a particular node or line must remain stable, i.e., it cannot switch levels from logic low to logic high. Data not remaining stable for at least the required hold time will cause an incorrect logic level to be processed in the circuit. One approach to preventing hold time variations is to delay data within the data path of a device. Conventional elements for delaying data, e.g., delay buffers, may significantly increase current leakage and power consumption by substantially increasing the number of transistors in the data path.

SUMMARY

All aspects, examples and features mentioned herein can be combined in any technically possible way.

Embodiments disclosed herein provide a structure including a launch pulse latch coupled to a capture pulse latch through a data path, the data path including a combinational logic for processing signals within the data path, wherein an edge of a clock signal drives the launch pulse latch and the capture pulse latch; and a lockup latch within the data path between the launch pulse latch and the capture pulse latch, wherein an inverse of the clock signal drives the lockup latch.

Another aspect of the disclosure includes any of the preceding aspects, and wherein one of the launch pulse latch and the capture pulse latch each include a plurality of latches configured to implement a flip-flop operation.

Another aspect of the disclosure includes any of the preceding aspects, and further including a first pulse generator coupled between a clock generator and each of the launch pulse latch and the lockup latch, wherein the first pulse generator transmits the clock signal to the launch pulse latch and the inverse of clock signal to the lockup latch.

Another aspect of the disclosure includes any of the preceding aspects, and further including a second pulse generator coupled between the clock generator and the capture pulse latch, the second pulse generator configured to transmit the clock signal to the capture pulse latch.

Another aspect of the disclosure includes any of the preceding aspects, and wherein the lockup latch is configured to delay data from the launch pulse latch by a half cycle of the clock signal.

Another aspect of the disclosure includes any of the preceding aspects, and wherein the lockup latch is configured to delay data from the launch pulse latch by approximately five nanoseconds (ns), and wherein a full cycle of the clock signal is approximately ten ns.

Another aspect of the disclosure includes any of the preceding aspects, and further including a hold buffer within the data path between the launch pulse latch and the capture pulse latch, wherein a time delay of data within the hold buffer is different from a time delay within the lockup latch.

Further embodiments disclosed herein provide a structure including a combinational logic circuit for implementing a plurality of operations, wherein the combinational logic circuit defines a data path between an input port and an output port; a launch pulse latch coupled to the input port of the combinational logic circuit; a capture pulse latch coupled to the output port of the combinational logic circuit; a lockup latch between the launch pulse latch and one of the combinational logic circuit and the capture pulse latch; and a clock generator coupled to the launch pulse latch, the capture pulse latch, and the lockup latch, wherein the clock generator transmits a clock signal to the launch pulse latch and the capture pulse latch and an inverse of the clock signal to the lockup latch.

Another aspect of the disclosure includes any of the preceding aspects, and wherein one of the launch pulse latch and the capture pulse latch each include a plurality of latches configured to implement a flip-flop operation.

Another aspect of the disclosure includes any of the preceding aspects, and wherein the clock generator includes a first pulse generator coupled between a clock generator and each of the launch pulse latch and the lockup latch, wherein the first pulse generator transmits the clock signal to the launch pulse latch and the inverse of clock signal to the lockup latch.

Another aspect of the disclosure includes any of the preceding aspects, and wherein the clock generator further includes a second pulse generator coupled between the clock generator and the capture pulse latch, the second pulse generator configured to transmit the clock signal to the capture pulse latch.

Another aspect of the disclosure includes any of the preceding aspects, and wherein the lockup latch is configured to delay data from the launch pulse latch by a half cycle of the clock signal.

Another aspect of the disclosure includes any of the preceding aspects, and wherein the lockup latch is configured to delay data from the launch pulse latch by approximately five nanoseconds (ns), and wherein a full cycle of the clock signal is approximately ten ns.

Another aspect of the disclosure includes any of the preceding aspects, and further including a hold buffer within the data path between the launch pulse latch and the capture pulse latch, wherein a time delay of data within the hold buffer is different from a time delay within the lockup latch.

Further embodiments disclosed herein provide a method including transmitting a clock signal such that an edge of the clock signal drives a launch pulse latch and a capture pulse latch, wherein the launch pulse latch is coupled to the capture pulse latch through a data path including a combinational logic for processing signals within the data path; and transmitting an inverse of the clock signal to a lockup latch within the data path between the launch pulse latch and the capture pulse latch.

Another aspect of the disclosure includes any of the preceding aspects, and wherein transmitting the clock signal and the inverse of the clock signal includes passing the clock signal from a clock generator through a first pulse generator coupled between the clock generator and each of the launch pulse latch and the lockup latch, wherein the first pulse generator transmits the clock signal to the launch pulse latch and the inverse of clock signal to the lockup latch.

Another aspect of the disclosure includes any of the preceding aspects, and wherein transmitting the clock signal and the inverse of the clock signal includes passing the clock signal from the clock generator through a second pulse generator coupled between the clock generator and the capture pulse latch to transmit the clock signal to the capture pulse latch.

Another aspect of the disclosure includes any of the preceding aspects, and further including delaying data from the launch pulse latch in the lockup latch by a half cycle of the clock signal.

Another aspect of the disclosure includes any of the preceding aspects, and wherein a full cycle of the clock signal is approximately ten nanoseconds (ns), and wherein the half cycle of the clock signal is approximately five ns.

Another aspect of the disclosure includes any of the preceding aspects, and further including passing data within the data path through a hold buffer between the launch pulse latch and the capture pulse latch, wherein a time delay of data within the hold buffer is different from a time delay within the lockup latch.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
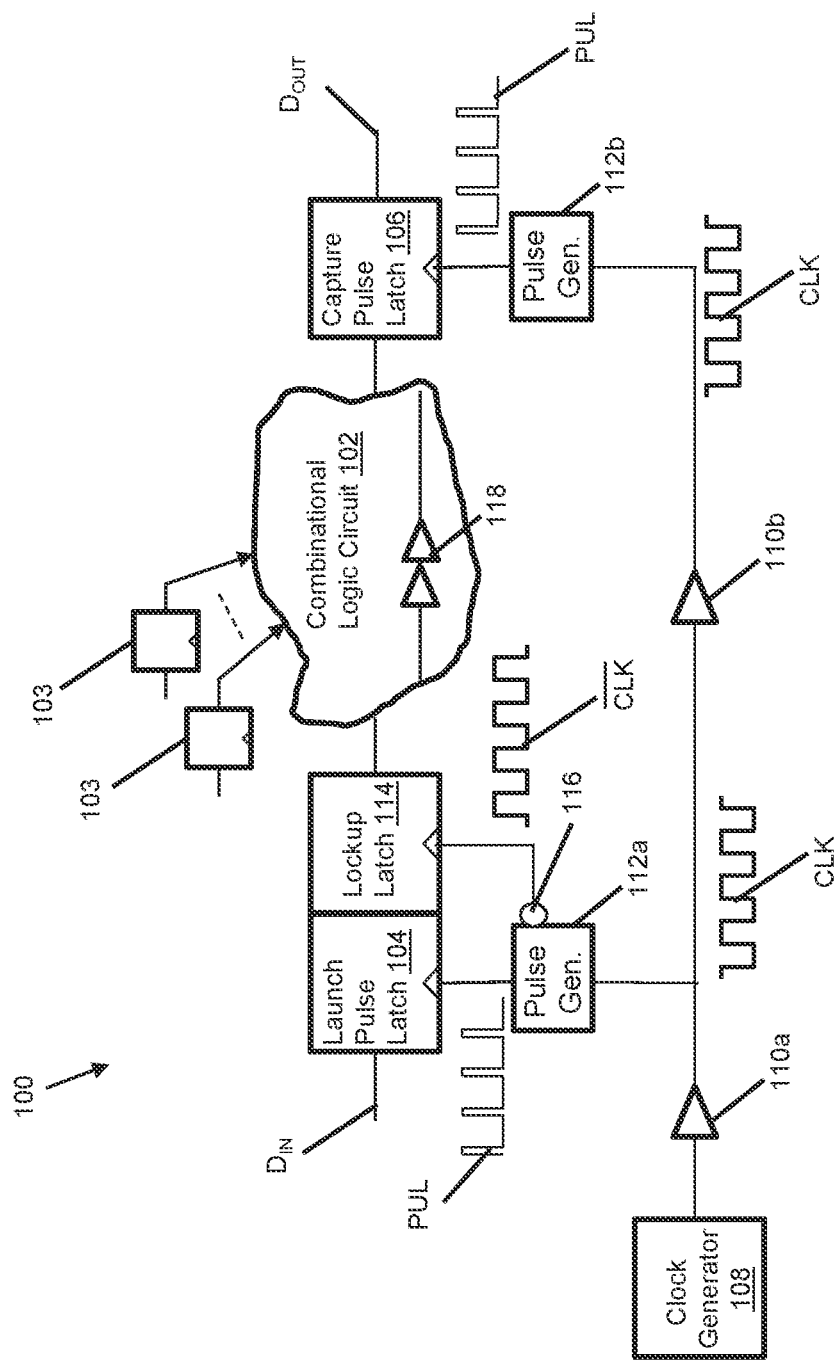
FIG. 1 provides a schematic diagram of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure and related method for delaying of a data system using a lockup latch driven by an inverse clock signal. A structure according to the disclosure includes a launch pulse latch coupled to a capture latch through a data path. The data path may include or pass through a set of combinational logic (i.e., sets of AND gates, OR gates, etc., defining logical functions) for processing signals within the data path. The rising edge of a signal pulse is transmitted to the launch pulse latch and the capture pulse latch to enable transmitting data to, and collecting data from, the data path. An edge of the clock signal (e.g., a rising edge or falling edge produced by transitioning from a logic low), e.g., signified by a waveform produced from a pulse generator, may drive the launch pulse latch and the capture pulse latch. A lockup latch is within the data path between the launch pulse latch and the capture pulse latch. An inverse of the clock signal drives the lockup latch, e.g., to delay the processing data by a half cycle of the clock as discussed herein.

FIG. 1 depicts a schematic view of a structure 100 for processing an input data signal ($D_{IN}$) via a set of logic components to produce an output data signal ($D_{OUT}$). Embodiments of structure 100 may be suitable for use with a combinational logic circuit 102 for implementing various functions to convert input data signal $D_{IN}$ into output data signal $D_{OUT}$. Structure 100 may include various components for launching and capturing the data to be processed in combinational logic circuit 102, e.g., as digital signals capable of being processed within combinational logic circuit 102. Combinational logic circuit 102 may be coupled to and/or may include sequential elements 103 (e.g., other logic gates and/or signal processing circuitry) for affecting the processing of input data signal $D_{IN}$ into output data signal $D_{OUT}$. Sequential elements 103 may be driven by the same clock signal as other elements in structure 100, and/or may be driven by a separate connection to a clock generator and/or may be provided from other circuitry coupled to structure 100.

Structure 100 moreover includes various elements to synchronize the launching and capturing of data to prevent hold time failures as structure 100 operates. Structure 100 may include a launch pulse latch 104 for the launching of input data signal $D_{IN}$ into combinational logic circuit 102 and a capture pulse latch 106 for receiving and relaying output data signal(s) $D_{OUT}$ produced from combinational logic circuit 102. Launch pulse latch 104 and capture pulse latch 106 may include, e.g., combinations of interconnected transistors for switching between high and low logic levels for recording of data transmitted thereto.

A latch refers to an electrical element capable of temporarily storing data as a corresponding logic level during a specified time window determined by a clock waveform for electrically driving the latch. Launch pulse latch 104 and launch capture latch 106 each may be implemented by any one of a variety of approaches, e.g., a combination of negative AND ("NAND") or negative OR ("NOR") gates, interconnected complementary metal oxide semiconductor (CMOS) transmission gates, a tri-state gate (or CMOS transmission gate with a feedback circuit). A clock signal ("CLK") discussed herein may be used to provide pulsed waveforms to the latch such that data passes into the launch pulse latch 104 and capture latch 106 synchronously with incoming clock pulses. Latches are "level controlled" devices, i.e., their stored logic level may change based on the voltage of a signal supplied to the latch. Flip-flops are similar elements for storing of data but differ from latches by being controlled by the rising or falling edge of the clock waveform.

Pulse latches occupy have smaller area as compared to flip flops, and they can implemented to reduce the total number of transistors (in turn, reducing leakage and total power). Operating a pulse latch requires careful control of pulse widths transmitted to the pulse latch. In low voltage applications, there is more variability in pulse widths, creating a greater risk of hold time variations. This also requires careful control of the pulse width of the low voltage operations. To compensate for risk of hold violations, combinational logic circuits may include multiple hold buffers for delaying signals within the a data pathway. Conventional approaches for further reducing hold time violations have included, e.g., adding one additional pulse latch to reduce holt time violations in the data pathway. However, this is approach requires additional pulse generational and pulse width control on the opposite edge of the clock, thus undesirably increasing design and control complexity.

Pulse latches such as launch pulse latch 104 and capture pulse latch 106 differ from conventional latches by being synchronized with the incoming clock for driving the pulse latches, and thus may implement a flip-flop operation (i.e., recording of ones and zeros on rising and falling clock edges) without needing the specific circuitry for being edge controlled rather than level controlled. Thus, pulse latches such as launch pulse latch 104 and capture pulse latch 106 offer an alternative to flip flops with fewer components and higher performance so long as their operation remains synchronized with the clock waveforms provided thereto. In many instances, pules latches will rely upon pulse generators, which provide pulse clock waveforms based on an incoming clock signal transmitted to the pulse generators. The pulse generators may select a pulse width for facilitating a transition between the incoming clock and the pulse width(s) required for driving the latches to which they connect. Each pulse may be generated synchronously with the rising edge or falling edge of an incoming clock signal, such that only the rising edge or falling edge of the clock signal drives the launching or capturing of data in each latch 104, 106.

A clock generator 108 may be coupled to launch pulse latch 104 and capture pulse latch 106 through, e.g., one or more buffers 110 and pulse generators 112 ("Pulse Gen" in drawings). The outgoing pulse signals (designated "PUL" in FIG. 1) may have a smaller pulse width than the incoming clock signal ("CLK" in FIG. 1), such that only the rising or falling edge of the clock signal will drive the operation of latches 104, 106. Clock generator 108 may be any currently known or later developed circuit for outputting a continuous signal cycling between high and low logic levels at a predetermined frequency. Buffers 110 (separately identified as 110a, 110b) may be any currently known or later developed logic component (e.g., two serially coupled inverters) for delaying the travel time of a signal passing therethrough without affecting the data encoded within such a signal. Buffers 110 differ from latches 104, 106, 114 discussed herein by including two voltage inverters with requisite drive strength and delay, thus only affecting the transmission time of the clock signal within each buffer 110. Pulse generators 112 (separately identified as 112a, 112b, respectively) may transmit pulses (waveform "PUL" shown in FIG. 1) to launch pulse latch 104 and capture pulse latch 106, respectively. Each pulse generator 112 may be embodied as any currently or later developed circuit component for generating pulses with a predetermined pulse width, e.g., based on the latch characteristics. Pulse generators 112 may be used to control various aspects of the waveform including, without limitation, pulse frequency, pulse width, delay with respect to specified triggers, the amplitude (i.e., high- and low-voltage levels) of the pulses, rise time, and/or fall time, etc., of the signal pulses.

The combination of clock generator 108, buffer 110a, and pulse generators 112a, 112b may be configured such that an identical clock waveform (CLK) is transmitted to each pulse latch 104, 106. In some cases, one pulse generator 112 may be shared for launch pulse latch 104 and capture pulse latch 106. Despite the presence of clock generator 108, buffers 110a, and pulse generators 112a, 112b, the arrival time of signals leaving combinational logic circuit 102 may not automatically comply with hold time requirements for entry and processing within capture pulse latch 106. Buffer 110b delays the clock signal before it reaches capture pulse latch 106, thus posing a higher risk of hold time violations. Buffer 110b may be required, however, to implement a predetermined clock tree design for a known set of setup violation fixes. Embodiments of structure 100 thus include further elements to prevent old time violations for signals as they arrive at capture pulse latch 106.

Structure 100 includes a lockup latch 114 coupled to pulse generator 112a through an inverter 116, In some implementations, inverter 116 may be distinct from pulse generator(s) 112a, 112b. In the example of FIG. 1, inverter 116 may be structurally, integrated into pulse generator 112a, i.e., to invert clock signal CLK for transmission to lockup latch 114 while simultaneously generating pulse waveform PUL for transmission to launch pulse latch 104. Lockup latch 114 differs from launch pulse latch 104 and capture pulse latch 106, e.g., by storing logic levels based on the voltage of a pulses transmitted thereto (i.e., it is "level controlled"), rather than receiving pulses PUL and/or being synchronized with launch pulse latch 104 and capture pulse latch 106. Inverter 116 may invert the voltage polarity of clock signal CLK to produce an inverse of clock signal CLK ("$\overline{\text{CLK}}$") transmitted to lockup latch 114. Embodiments of the disclosure rely upon the inverted half-cycle of signals exiting launch pulse latch 104 to delay signals by one half of the clock cycle.

Combinational logic circuit 102 itself, optionally, may include hold buffers 118 therein to further delay signals and reduce hold time violations for capturing data in capture pulse latch 106. The total extent of delay created in hold buffers 118 may be less than the amount of delay provided by lockup latch 114. Lockup latch 114, among other things, can provide a longer time delay than multiple hold buffers 118 within combination logic circuit 102 without requiring as many transistors as would otherwise be needed to provide hold buffers 118. For example, lockup latch 114 may delay data passing therethrough by approximately five nanoseconds (ns), based on a full cycle of clock signal CLK being approximately ten ns. It is understood that embodiments of structure 100 are operable with clock generators 108 operating at any conceivable frequency, e.g., twenty ns, fifty ns, one-hundred ns, etc. The number of hold buffers 118 in combinational logic circuit 102 may be user selected, but in any case, may delay signals passing therethrough by less than a half cycle of clock signal CLK. Notwithstanding the delay in lockup latch 114, combinational logic circuit 102, launch pulse latch 104, and capture pulse latch 106 may operate in the same manner as if lockup latch 114 were not included in structure 100. Thus, the function of lockup latch 114 during operation is solely to increase the hold time of signals exiting combinational logic circuit 102 and not to modify the data as it passes from launch pulse latch 104 to capture pulse latch 106.

Figure 2:
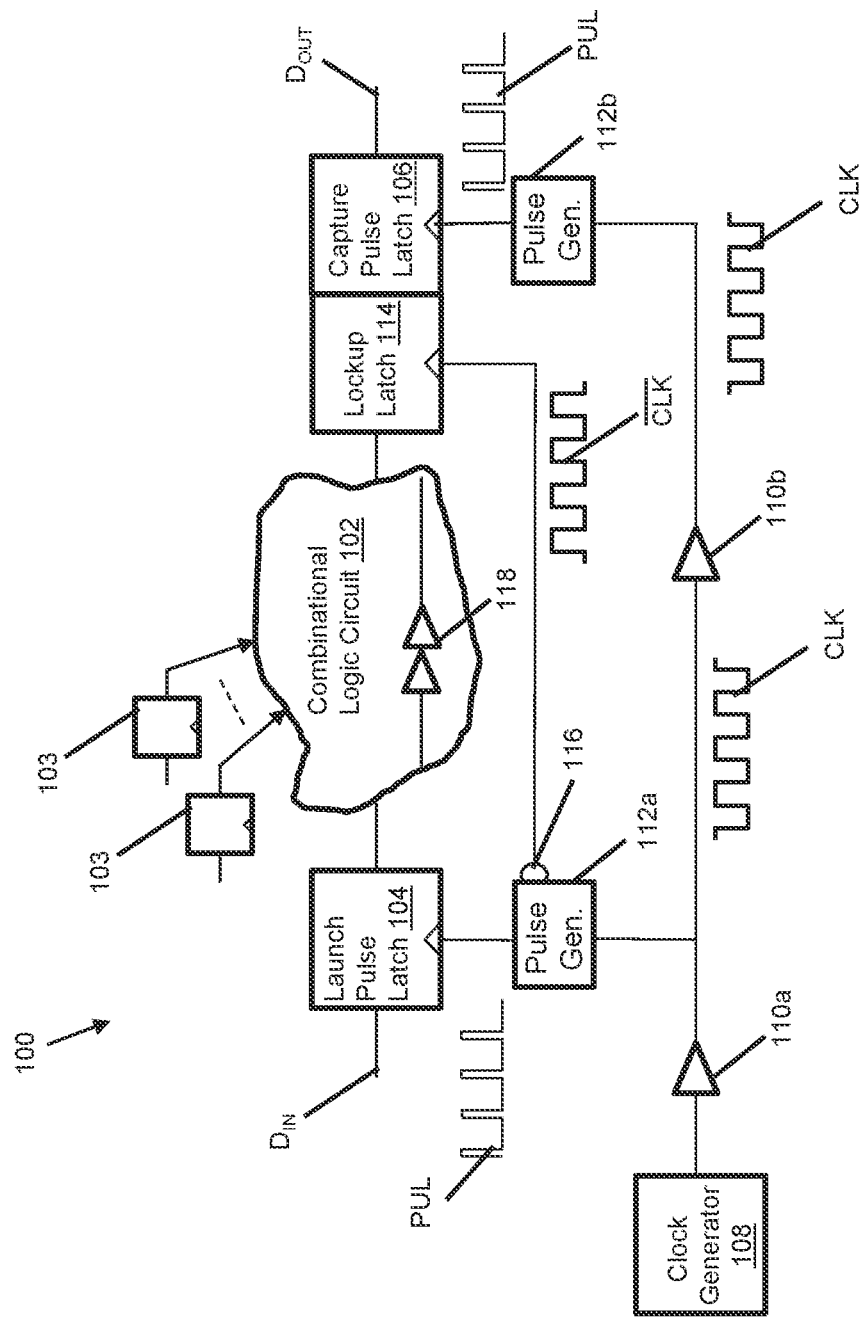
FIG. 2 provides a schematic diagram of a structure according to further embodiments of the disclosure.

Turning to FIG. 2, structure 100 is shown according to an alternative configuration. The technical benefits of lockup latch 114 in structure 100 may be attained regardless of whether lockup latch 114 is located in a data pathway following (e.g., immediately after) launch pulse latch 104, before (e.g., immediately preceding) capture pulse latch 106, and/or elsewhere within combinational logic circuit 102. Thus, embodiments of structure 100 may include lockup latch 114 between the output terminal(s) of combinational logic circuit 102 and the input terminal(s) of capture pulse latch 106. In this configuration, lockup latch 114 may further delay incoming signals (e.g., by a half clock cycle as discussed herein) after the signal has already been delayed, optionally, in one or more hold buffers 118 of combinational logic circuit 102. In addition, lockup latch may receive an inversion of clock signal CLK from inverter 116 (e.g., as a subcomponent of pulse generator 112a) as shown in FIG. 2 and discussed elsewhere herein relative to other examples. In still further configurations, lockup latch 114 may receive the inversion of the clock signal from second pulse generator 112b and/or other pulse generators of a product.

Figure 3:
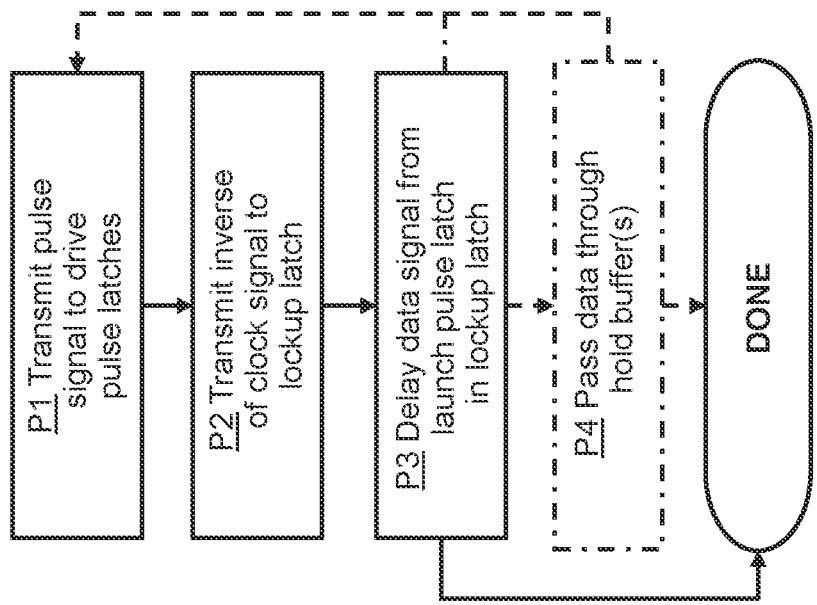
FIG. 3 provides an illustrative flow diagram of a method according to embodiments of the disclosure.

Referring now to FIGS. 1 and 3, in which FIG. 3 provides an illustrative flow diagram of several processes, embodiments of the disclosure may provide methods for delaying of data signals through combinational logic circuit 102 in structure 100 using lockup latch 114. In process P1, clock generator 108 may transmit clock signal CLK to pulse generator(s) 112a, 112b, thereby providing pulse signal PUL to latches 104, 106. Optionally, clock signal CLK may be transmitted through buffers to delay the arrival time of clock signal CLK in pulse generator(s) 112a, 112b. Pulse signals PUL from pulse generator(s) 112a, 112b will drive launch pulse latch 104 and capture pulse latch 106, e.g., to transmit input data to combinational logic circuit 102 and capture output data from combinational logic circuit 102. As discussed elsewhere herein, pulse latches 104, 106 are synchronized despite their different functions such that each pulse latch 104, 106 implements a flip-flop operation (i.e., logic levels change at the rising or falling edge of clock signals for driving each latch 104, 106).

In process P2, one pulse generator (e.g., first pulse generator 112a) may transmit an inverse of clock signal CLK to lockup latch 114, e.g., via inverter 116. The inverse clock signal supplied to lockup latch 114 thus may enable process P3 of delaying the data signal from launch pulse latch 104 in lockup latch 114 by a specified interval. The delay in lockup latch 114 may be, e.g., one half cycle of clock signal CLK as discussed herein. Optionally, methods of the disclosure may include process P4 of further delaying data in combinational logic circuit 102 using hold buffers 118 as discussed herein. The method may then repeat (i.e., by returning to process P1) for each consecutive data cycle or may end ("Done") once all data from launch pulse latch 104 arrives in capture pulse latch 106.

Embodiments of the disclosure provide various technical and commercial advantages, examples of which are discussed herein. Compared to conventional approaches to delay signals and prevent hold time errors, embodiments of the disclosure enables reliable low voltage operation of combinational logic circuit 102 due to the presence of one lockup latch in the circuit structure instead of additional pulse latches or flip flops. In addition, using a lockup latch reduces demand for buffers within the combinational logic, thereby reducing current leakage and power consumption during operation of a device. The use of a lockup latch within the structure between a pair of corresponding launch and capture latches may provide these and other benefits while reducing the total surface area of a product, e.g., by reducing the total number of transistors used as discussed herein.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
   a clock generator for generating a clock signal;
   a launch pulse latch coupled to a capture pulse latch through a data path, the data path including combinational logic for processing signals within the data path, wherein an edge of a pulse signal corresponding to the clock signal drives the launch pulse latch and the capture pulse latch;
   a lockup latch within the data path between the launch pulse latch and the capture pulse latch, wherein an inverse of the clock signal drives the lockup latch;
   a first pulse generator for transmitting the pulse signal corresponding to the clock signal to the launch pulse latch and for transmitting the inverse of the clock signal to the lockup latch; and
   a second pulse generator for transmitting the pulse signal corresponding to the clock signal to the capture pulse latch.

2. The structure of claim 1, wherein one of the launch pulse latch and the capture pulse latch each include a plurality of latches configured to implement a flip-flop operation.

3. The structure of claim 1, wherein the lockup latch is configured to delay data from the launch pulse latch by a half cycle of the clock signal.

4. The structure of claim 1, wherein the lockup latch is configured to delay data from the launch pulse latch by approximately five nanoseconds (ns), and wherein a full cycle of the clock signal is approximately ten ns.

5. The structure of claim 1, further comprising a hold buffer within the data path between the launch pulse latch and the capture pulse latch, wherein a time delay of data within the hold buffer is different from a time delay within the lockup latch.

6. A structure comprising:
   a combinational logic circuit for implementing a plurality of operations, wherein the combinational logic circuit defines a data path between an input port and an output port;
   a launch pulse latch coupled to the input port of the combinational logic circuit;
   a capture pulse latch coupled to the output port of the combinational logic circuit;
   a lockup latch between the launch pulse latch and one of the combinational logic circuit and the capture pulse latch;
   a clock generator for generating a clock signal;
   a first pulse generator for transmitting a pulse signal corresponding to the clock signal to the launch pulse latch and for transmitting an inverse of the clock signal to the lockup latch; and
   a second pulse generator for transmitting the pulse signal corresponding to the clock signal to the capture pulse latch.

7. The structure of claim 6, wherein one of the launch pulse latch and the capture pulse latch each include a plurality of latches configured to implement a flip-flop operation.

8. The structure of claim 6, wherein the lockup latch is configured to delay data from the launch pulse latch by a half cycle of the clock signal.

9. The structure of claim 6, wherein the lockup latch is configured to delay data from the launch pulse latch by approximately five nanoseconds (ns), and wherein a full cycle of the clock signal is approximately ten ns.

10. The structure of claim 6, further comprising a hold buffer within the data path between the launch pulse latch and the capture pulse latch, wherein a time delay of data within the hold buffer is different than a time delay within the lockup latch.

11. A method comprising:
    converting a clock signal generated by a clock generator to a pulse signal;
    transmitting the pulse signal to a launch pulse latch and a capture pulse latch, such that an edge of the pulse signal drives the launch pulse latch and the capture pulse latch, wherein the launch pulse latch is coupled to the capture pulse latch through a data path including combinational logic for processing signals within the data path; and
    transmitting an inverse of the clock signal to a lockup latch within the data path between the launch pulse latch and the capture pulse latch, wherein the inverse of the clock signal drives the lockup latch.

12. The method of claim 11, further comprising delaying data from the launch pulse latch in the lockup latch by a half cycle of the clock signal.

13. The method of claim 12, wherein a full cycle of the clock signal is approximately ten nanoseconds (ns), and wherein the half cycle of the clock signal is approximately five ns.

14. The method of claim 11, further comprising passing data within the data path through a hold buffer between the launch pulse latch and the capture pulse latch, wherein a time delay of data within the hold buffer is different from a time delay within the lockup latch.

* * * * *